US010579473B2

(12) United States Patent
Vanaparthy et al.

(10) Patent No.: US 10,579,473 B2
(45) Date of Patent: Mar. 3, 2020

(54) MITIGATING SILENT DATA CORRUPTION IN ERROR CONTROL CODING

(71) Applicant: Intel Corporation, Santa Clara, CA (US)

(72) Inventors: Santhosh K. Vanaparthy, Santa Clara, CA (US); Ravi H. Motwani, Fremont, CA (US); Zion S. Kwok, Vancouver (CA)

(73) Assignee: Intel Corporation, Santa Clara, CA (US)

(*) Notice: Subject to any disclaimer, the term of this patent is extended or adjusted under 35 U.S.C. 154(b) by 69 days.

(21) Appl. No.: 15/721,291

(22) Filed: Sep. 29, 2017

(65) Prior Publication Data

US 2019/0102248 A1 Apr. 4, 2019

(51) Int. Cl.
| | | |
|---|---|---|
| G11C 29/00 | (2006.01) |
| G06F 11/10 | (2006.01) |
| H03M 13/37 | (2006.01) |
| G11C 29/52 | (2006.01) |
| H03M 13/15 | (2006.01) |
| H03M 13/11 | (2006.01) |
| G06F 11/00 | (2006.01) |

(52) U.S. Cl.
CPC ...... *G06F 11/1068* (2013.01); *G06F 11/1004* (2013.01); *G11C 29/52* (2013.01); *H03M 13/3738* (2013.01); *G06F 11/00* (2013.01); *H03M 13/1128* (2013.01); *H03M 13/1515* (2013.01)

(58) Field of Classification Search
CPC ............... H03M 13/3738; G11C 29/52; G06F 11/1068; G06F 11/1004
See application file for complete search history.

(56) References Cited

U.S. PATENT DOCUMENTS

| | | | | |
|---|---|---|---|---|
| 5,285,454 A | * | 2/1994 | Blaum | H03M 13/51 714/752 |
| 6,381,726 B1 | | 4/2002 | Weng | |
| 6,606,726 B1 | | 8/2003 | Wilhelmsson et al. | |
| 9,391,644 B2 | * | 7/2016 | Gadat | H03M 13/3753 |
| 2008/0155372 A1 | * | 6/2008 | Kravitz | H03M 13/1105 714/752 |
| 2012/0079353 A1 | | 3/2012 | Liikanen et al. | |

(Continued)

OTHER PUBLICATIONS

Extended European Search Report in European Patent Application No. EP18191338 dated Feb. 21, 2019, 10 pages.

(Continued)

*Primary Examiner* — Samir W Rizk
(74) *Attorney, Agent, or Firm* — Grossman, Tucker, Perreault & Pfleger, PLLC

(57) ABSTRACT

One embodiment provides a silent data corruption (SDC) mitigation circuitry. The SDC mitigation circuitry includes a comparator circuitry and an SDC mitigation logic. The comparator circuitry is to compare a successful decoded codeword and a corresponding received codeword, the successful decoded codeword having been deemed a success by an error correction circuitry. The SDC mitigation logic is to reject the successful decoded codeword if a distance between the corresponding received codeword and the successful decoded codeword is greater than or equal to a threshold.

15 Claims, 3 Drawing Sheets

(56) References Cited

U.S. PATENT DOCUMENTS

2018/0196614 A1* 7/2018 Ivanov ................ G06F 11/1048
2018/0351581 A1* 12/2018 Presman ........... H03M 13/2927

OTHER PUBLICATIONS

Hamidi-Sepehr Fatemeh et al: "Delay-Sensitive Communication Over Fading Channels: Queueing Behavior and Code Parameter Selection", IEEE Transactions on Vehicular Technology, IEEE Service Center, Piscataway, NJ, US, vol. 64, No. 9, Sep. 1, 2015 (Sep. 1, 2015), pp. 3957-3970, XP011668981,ISSN: 0018-9545, DOI:10.1109/TVT.2014.2365181 [retrieved on Sep. 15, 2015] p. 3964-p. 3966, attachment is 14 pages.

* cited by examiner

MITIGATING SILENT DATA CORRUPTION IN ERROR CONTROL CODING

FIELD

The present disclosure relates to silent data corruption, in particular to, mitigating silent data corruption in error control coding.

BACKGROUND

Error-correcting codes (ECCs) may be utilized to facilitate accurate data retrieval from memory devices including, for example, NAND flash memory, NOR flash memory, three dimensional crosspoint memory (3DXP), etc. The error correcting codes are configured to mitigate errors that may be caused by nonideal characteristics of the media. Error correcting codes may provide a reliability that is smaller than an Uncorrectable Bit Error Rate (UBER) of, for example, 1E-17, with an input (i.e., raw) Bit-Error Rate (RBER) of around 1E-3. This may be accomplished by encoding a sequence of K data bits into a sequence of N codeword bits that include N−K parity bits. The N bit codeword may then be stored on the media. Errors introduced by the nonideal characteristics of the media may be included in data read from the media. A decoder may be configured to recover the encoded sequences of K bits in the presence of at least some errors.

Output of the decoder includes three possible outcomes: 1) data that is corrected to the intended codeword and the decoder declares a success, 2) data that is not corrected and the decoder declares a failure, or 3) data that is decoded to an unintended codeword and the decoder declares a success. The first possible outcome is preferred. The second possible outcome is known as an "ECC fail" and may be included in the UBER. The third possible outcome is known as a "Silent Data Corruption" (SDC) or a "Miscorrect" event. An SDC event is generally undesirable.

BRIEF DESCRIPTION OF DRAWINGS

Features and advantages of the claimed subject matter will be apparent from the following detailed description of embodiments consistent therewith, whose description should be considered with reference to the accompanying drawings, wherein:

Figure 1:
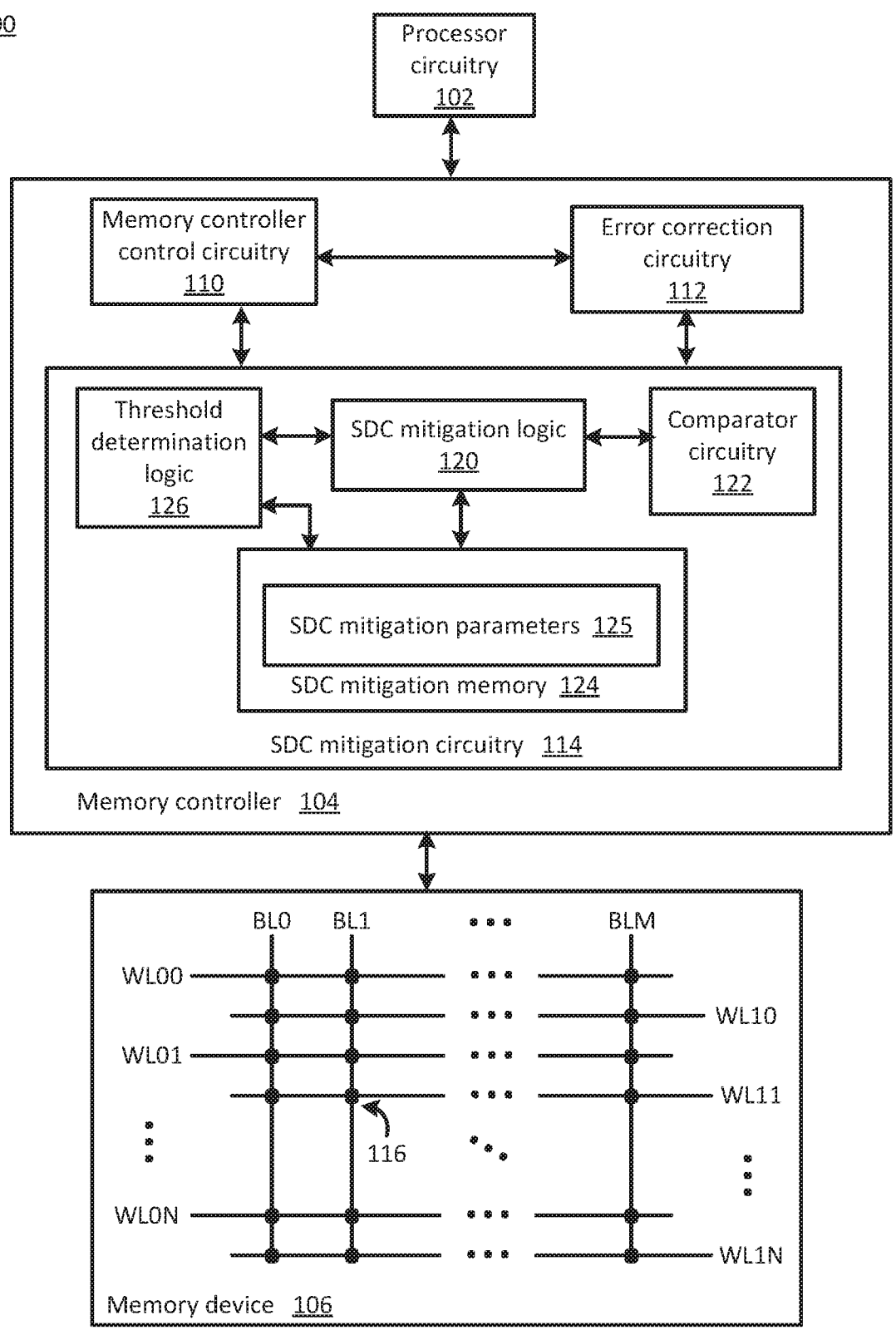
FIG. 1 illustrates a functional block diagram of a silent data corruption (SDC) mitigation system consistent with several embodiments of the present disclosure.

Although the following Detailed Description will proceed with reference being made to illustrative embodiments, many alternatives, modifications, and variations thereof will be apparent to those skilled in the art.

DETAILED DESCRIPTION

For a given input RBER, a probability of an SDC event ("SDC probability") is typically lower than the UBER at that RBER. Generally, the SDC probability is related to the RBER and increases as the RBER increases. A memory device specification may specify a maximum SDC probability that is to be met for a range of RBERs, including, for example, an RBER of 0.5 that corresponds to a received codeword that is a random sequence. For example, the memory device specification may include a maximum SDC probability of 1E-25. This specification may be relatively easier to meet for relatively small RBER (e.g., when RBER is less than 1E-3) but relatively more difficult to meet for relatively large RBER such as 0.5. Relatively large RBERs are related to failure modes of selected memory devices, e.g., word line or bit line failures.

One example technique configured to detect an SDC event is through the addition of Cyclic Redundancy Check (CRC) bits to the data sequence. For example, a 32-bit CRC may reduce an SDC probability by ten orders of magnitude. However, the additional bits for the CRC may decrease an overall code-rate and thus increase associated overhead. Circuitry to determine the CRC bits at the encoder may add complexity and adds to the latency. Similarly, at the decoder, verifying the integrity of the decoded codeword (to detect mis-detect) using the CRC adds complexity and increases latency.

Generally, this disclosure relates to mitigating silent data corruption in error control coding. An apparatus, method and/or system are configured to compare a successful decoded codeword and a corresponding received codeword. As used herein, a successful decoded codeword is a decoded codeword that has been deemed a success by an error correction circuitry. The apparatus, method and/or system are further configured to reject the successful decoded codeword if a distance between the corresponding received codeword and the successful decoded codeword is greater than or equal to a threshold.

The threshold may be determined based, at least in part, on a particular error correcting code (ECC), the RBER and the UBER. The threshold is configured to facilitate rejecting successful decoded codewords when a number of bit errors between the successful decoded codeword and the received codeword is relatively large. Relatively large in this context corresponds to a received codeword relatively close to a decoding sphere boundary of the successful decoded codeword, i.e., relatively distant from the successful decoded codeword. The distance corresponds to a Hamming distance. A received codeword that is relatively distant from the successful decoded codeword may be relatively more likely to be associated with an SDC event than a received codeword that is relatively closer to the successful decoded codeword. In an embodiment, the threshold may be determined based, at least in part, on a binomial distribution cumulative density function and based, at least in part, on a change in UBER, as will be described in more detail below.

The apparatus, method and/or system are configured to operate on successful decoded codewords that have been deemed successes by the error correction circuitry and, thus, do not affect the configuration and/or operation of the error correction circuitry. The distance corresponds to a Hamming distance and may thus be determined by a bit-wise comparison of two codewords. Such bit-wise comparisons may be implemented by relatively simple comparator circuitry and the comparison operations may be performed relatively quickly, for example, within two clock cycles. The threshold may be determined based, at least in part, on the error correcting code implemented by the error correction circuitry. The threshold may further be determined based, at least in part, on whether the codewords may be punctured and/or whether erasures may be present.

In one embodiment, the error correcting code may comply and/or be compatible with a low density parity check (LDPC) error correcting code. In another embodiment, the error correcting code may comply and/or be compatible with a Reed-Solomon error correcting code. In this embodiment, the operations of the apparatus, method and/or system may not affect a symbol correction strength, as will be described in more detail below.

The apparatus, method and/or system are configured to achieve a target SDC probability for any RBER, including an RBER=0.5 of a random sequence. The target SDC probability may be achieved without significantly increasing an associated UBER. In one nonlimiting example, the UBER increase may be less than one percent of the UBER without SDC mitigation. For example, an SDC probability may be reduced by approximately 10 to 50 orders of magnitude depending on block length and/or code rate, as described herein.

FIG. 1 illustrates a functional block diagram of a silent data corruption (SDC) mitigation system 100 consistent with several embodiments of the present disclosure. SDC mitigation system 100 may correspond to, and/or be included in, a mobile telephone including, but not limited to a smart phone (e.g., iPhone®, Android®-based phone, Blackberry®, Symbian®-based phone, Palm®-based phone, etc.); a wearable device (e.g., wearable computer, "smart" watches, smart glasses, smart clothing, etc.) and/or system; a computing system (e.g., a server, a workstation computer, a desktop computer, a laptop computer, a tablet computer (e.g., iPad®, GalaxyTab® and the like), an ultraportable computer, an ultramobile computer, a netbook computer and/or a subnotebook computer; etc.

SDC mitigation system 100 includes a processor circuitry 102, a memory controller 104 and a memory device 106. For example, processor circuitry 102 may correspond to a single core or a multi-core general purpose processor, such as those provided by Intel® Corp., etc. Memory controller 104 may be coupled to and/or included in processor circuitry 102 and is configured to couple processor circuitry 102 to memory device 106.

Memory device 106 may include, but is not limited to, a NAND flash memory (e.g., a Triple Level Cell (TLC) NAND or any other type of NAND (e.g., Single Level Cell (SLC), Multi Level Cell (MLC), Quad Level Cell (QLC), etc.)), NOR memory, solid state memory (e.g., planar or three Dimensional (3D) NAND flash memory or NOR flash memory), storage devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), byte addressable random accessible 3D crosspoint memory, ferroelectric transistor random access memory (Fe-TRAM), magnetoresistive random access memory (MRAM), phase change memory (PCM, PRAM), resistive memory, ferroelectric memory (F-RAM, FeRAM), spin-transfer torque memory (STT), thermal assisted switching memory (TAS), millipede memory, floating junction gate memory (FJG RAM), magnetic tunnel junction (MTJ) memory, electrochemical cells (ECM) memory, binary oxide filament cell memory, interfacial switching memory, battery-backed RAM, ovonic memory, nanowire memory, electrically erasable programmable read-only memory (EEPROM), etc. In some embodiments, the byte addressable random accessible 3D crosspoint memory may include a transistor-less stackable cross point architecture in which memory cells sit at the intersection of words lines and bit lines and are individually addressable and in which bit storage is based on a change in bulk resistance.

Memory device 106 includes a first plurality of word lines (WLs) WL00, WL01, ..., WL0N, a second plurality of word lines WL10, WL11, ..., WL1N, a plurality of bit lines (BL) BL0, BL1, ..., BLM and a plurality of memory cells, e.g., memory cell 116. Each WL may cross a BL at a memory cell, e.g., memory cell 116. For example, the first plurality of WLs WL00, WL01, ..., WL0N, the plurality of BLs BL0, BL1, ..., BLM and the corresponding plurality of memory cells may correspond to a first deck and the second plurality of WLs WL10, WL11, ..., WL1N, the plurality of BLs BL0, BL1, ..., BLM and the corresponding plurality of memory cells may correspond to a second deck of a pair of decks. Thus, each deck may include an array of memory cells and memory device 106 may include a plurality of decks.

Processor circuitry 102 may be configured to provide a memory access request, e.g., a write request and/or a read request, to memory controller 104. For example, the read request may include address information for data to be read from a memory location in memory device 106 that corresponds to the address information. The memory controller 104 may then be configured to manage reading the data from the memory device 106.

Memory controller 104 includes a memory controller control circuitry 110, error correction circuitry 112 and SDC mitigation circuitry 114. The memory controller control circuitry 110 is configured to determine an address of a target memory cell in response to a memory access request from processor circuitry 102. The memory controller control circuitry 110 is configured to identify a corresponding WL and a corresponding BL based, at least in part, on the determined address. The memory controller control circuitry 110 is further configured to select the target memory cell(s) and to write to or read from the selected target memory cell(s).

Memory controller control circuitry 110 is configured to receive data to be written to memory device 106 from processor circuitry 102, e.g., in response to a write request. Memory controller circuitry 110 may then be configured to provide the data to be written to error correction circuitry 112. Error correction circuitry 112 may be configured to encode the data to be written with error correction information to generate a corresponding codeword. In one example, error correction circuitry 112 may be configured to implement a low density parity check (LDPC) error correction technique. In another example, error correction circuitry 112 may be configured to implement a Reed-Solomon error correction technique.

Memory controller control circuitry 110 may then be configured to store the corresponding codeword in memory device 106. Memory controller control circuitry 110 may be configured to read the codeword in response to a read request and to provide the received codeword to error correction circuitry 112. Error correction circuitry 112 may then be configured to decode the received codeword.

The codeword may have a block length, N, that includes a number, N–k, of data bits and a number, k, of error correction bits. Block length corresponds to a total number of bits (N) in the codeword. The data bits correspond to information bits and the error correction bits correspond to parity bits. The block length may be related to a type of memory device. For example, for a memory device that includes NAND flash memory, the block length may be 4 kB (kilobytes). In another example, for a memory device that includes three-dimensional crosspoint memory, the block length may be 512 bytes. In another example, the block length may be 64 kB, 128 kB, or more. As used herein, "code rate" corresponds to a fraction of the codeword that is information bits, i.e., the number of information bits divided by the total number of bits in the codeword ((N−k)/N).

SDC mitigation circuitry 114 includes SDC mitigation logic 120, comparator circuitry 122, SDC mitigation memory 124 and threshold determination logic 126. SDC mitigation circuitry 114 is configured to perform SDC mitigation operations. SDC mitigation logic 120 is configured to retrieve a successful decoded codeword from error correction circuitry 112 and/or memory controller control circuitry 110. SDC mitigation memory 124 is configured to store one or more SDC mitigation parameters. SDC mitigation parameters 125 may include, but are not limited to, an RBER, an UBER, a maximum change (i.e., maximum allowable increase) in UBER (ΔUBER), an ECC identifier, puncture information and/or erasure information.

SDC mitigation parameters 125 may further include one or more threshold values. Each threshold value may be determined a priori and may be adjusted during operation. The threshold values may be determined, based, at least in part, on particular error correction technique, whether stored codewords may be punctured and/or an amount of erasures. Puncturing corresponds to including fewer than all of the information bits and/or fewer than all of the parity bits in a stored codeword. Puncturing may be implemented to more closely fit each codeword to a memory device storage architecture and/or capacity. Erasure corresponds to a bit that cannot be read due to a failure in the memory device. For example, a word line and/or a bit line may fail making a corresponding bit unavailable. For example, a nominal threshold value may be determined, a priori, based, at least in part, on error correction technique. The nominal threshold value may be adjusted based, at least in part, on whether stored codewords may be punctured and/or the amount of erasures. Whether stored codewords may be punctured may be known a priori. The amount of erasures may be known a priori and/or may change over the life of the memory device.

In an embodiment, the threshold, d, may be determined using a binomial distribution cumulative density function. As is known, a cumulative density function is related to a probability mass function. A binomial distribution with parameters N and p corresponds to a discrete probability distribution of a number of first outcomes of two possible outcomes in a sequence of N independent experiments. Each experiment has a boolean-valued (i.e., binary) outcome. Each outcome corresponds to a random variable containing single bit of information, e.g., first outcome with probability p or second outcome with probability q=1−p. As used herein, N corresponds to a number of bits in a codeword, the single bit of information corresponds to bit error/not bit error and the probability p corresponds to the RBER.

The probability of having exactly j first outcomes (i.e., bit errors) in N trials (i.e., number of bits in a codeword) is given by the binomial distribution probability mass function:

$$Pr(X = j) = \binom{N}{j} p^j (1-p)^{N-j}, j = 0, 1, 2, \ldots, N \text{ where}$$

$$\binom{N}{j} = \frac{N!}{j!(N-j)!}.$$

The corresponding binomial distribution cumulative density function (CDF) is:

$$Pr(X \leq j) = \sum_{i=0}^{\lfloor j \rfloor} \binom{N}{i} p^i (1-p)^{N-i}$$

where $\lfloor j \rfloor$ corresponds to the greatest integer less than or equal to j. Thus, the CDF corresponds to the probability of having as many as (i.e., less than or equal to) j bit errors in N bits and $1 - Pr(X \leq j)$ corresponds to the likelihood of having greater than j bit errors in N bits.

It may be appreciated that a threshold that is relatively close to the successful decoded codeword may result in an increased UBER and a rejection of correct successful decoded codewords. Conversely, a threshold that is relatively distant from the successful decoded codeword may not significantly affect the UBER but may correspond to an SDC event. Utilizing the CDF to determine the threshold is configured to reduce the likelihood of an SDC event without significantly increasing the UBER. For example, the likelihood of having greater than j bit errors in N bits may be set to a maximum allowable change in UBER (ΔUBER), i.e., $1 - Pr(X \leq j) = \Delta UBER.$ In one nonlimiting example, the ΔUBER may be less than or equal to 0.01*UBER. The distance, d, may then be set to the j that satisfies: $1 - Pr(X \leq j) = \Delta UBER$.

Thus, in operation, threshold determination logic 126 may be configured to determine the RBER and the UBER. For example, the RBER and the UBER may be included in the SDC mitigation parameters 125 that are stored in SDC mitigation memory 124. For example, the threshold determination logic 126 may be configured to retrieve the RBER and the UBER from the SDC mitigation memory 124. The threshold determination logic 126 may then be configured to identify the ECC implemented by error correction circuitry 112 and the corresponding codeword size, N. For example, the SDC mitigation parameters 125 may include an ECC identifier. The threshold determination logic 126 may then be configured to determine a maximum allowable change in UBER, ΔUBER, based, at least in part, on the UBER. The threshold determination logic 126 may then be configured to determine the threshold, d, based, at least in part, on N, RBER and ΔUBER, as described herein.

The threshold (nominal threshold value) may be determined, initially, without punctures and/or erasures. The SDC mitigation parameters 125 may be configured to include an indicator whether punctures and/or erasures are present and may further include bit locations of the punctures and/or erasures. Whether punctures are present may be known, a priori, and whether erasures are present may be determined in operation by, e.g., error correction circuitry 112. In some embodiments, the threshold may be updated if punctures and/or erasures are present. For example, the number of active bits in the codeword (i.e., the number of bits in the codeword minus the number of punctured and/or erased bits) may be utilized for N in the determination of the threshold. Thus, the threshold may be updated to accommodate punctures and/or erasures. A decision whether to accept or reject a successful decoded codeword may then be performed based on the active bits.

SDC mitigation logic 120 is configured to retrieve a received codeword from memory controller control circuitry 110 that corresponds to the successful decoded codeword.

The corresponding received codeword is the codeword read from memory device 106. The successful decoded codeword is the output from error correction circuitry 112 when the corresponding received codeword is input to the error correction circuitry 112. SDC mitigation logic 120 may be configured to ignore uncorrectable decoded codewords and corresponding received codewords.

SDC mitigation logic 120 may then be configured to provide the successful decoded codeword and the corresponding received codeword to comparator circuitry 122. Comparator circuitry 122 may then be configured to perform a bitwise comparison of the successful decoded codeword and the corresponding received codeword. SDC mitigation logic 120 may then be configured to determine the Hamming distance based, at least in part, on an output of comparator circuitry 122. Hamming distance corresponds to a number of unequal bits in a bit-wise comparison of two codewords.

SDC mitigation logic 120 may then be configured to determine whether the Hamming distance is greater than or equal to the threshold. For example, the threshold may be retrieved from SDC mitigation memory 124. If the Hamming distance is greater than or equal to the threshold, then the SDC mitigation logic 120 may be configured to reject the successful decoded codeword and to notify an uncorrectable bit error. For example, the notification may be provided to memory controller control circuitry 110.

Thus, an SDC mitigation system may be configured to reduce an SDC probability for successful decoded codewords corresponding to received codewords read from a memory device. SDC may be mitigated based, at least in part, on a threshold and a Hamming distance between a successful decoded codeword and a corresponding received codeword. A corresponding UBER may not be significantly increased.

In one nonlimiting example, for an LDPC error correcting code without puncturing and with erasures due to a die failure, the threshold may be set to 50. An RBER of 0.5 may then have a corresponding SDC probability of on the order of 1.00E-45. In another nonlimiting example, for LDPC error correction without puncturing and without a die failure, the threshold may be set to 80. An RBER of 0.5 may then have a corresponding SDC probability of 1E-64.

In one nonlimiting example, an LDPC codeword with an information size of 4256 (N−k) bits and a parity of 800 (k) bits, has a block length (N) of 5056 bits. In a memory device, e.g., memory device 106, a plurality of codewords may be spread across a plurality of dies. For an RBER of 8E-3 with the block length of 5056 bits, according to the binomial distribution with N=5056 and p=8E-3, the probability that there are more than 85 bit errors is approximately 2.7E-10. In other words, in the above equations, N=5056 and j=85 for a ΔUBER of 2.7E-10. A threshold of 85 bits may then result in an UBER for the RBER of 8E-3 of 3.0E-8+2.7E-10=3.027E-8. Similarly, at an RBER of 7E-3, the probability that there are more than 85 bit errors is 3.7E-13. Thus, the threshold of 85 bits may then result in an UBER at an RBER of 7E-3 by 1.2E-9+3.7E-13=1.20037E-9. Table 1 includes a range of UBERs for a range of RBERs for the LDPC codeword and threshold of 85 bits. Table 1 further includes an UBER change column. UBER change corresponds to ΔUBER, as described herein. According to simulation results, the SDC probability without SDC mitigation, as described herein, is less than 1.00E-19 and with SDC mitigation, as described herein, is less than 1.00E-54.

TABLE 1

| RBER | UBER | UBER Change |
|---|---|---|
| 3E-3 | 2.00000E-18 | 2.86E-36 |
| 4E-3 | 2.00000E-15 | 1.16E-27 |
| 5E-3 | 3.00000E-13 | 1.84E-21 |
| 6E-3 | 2.00001E-11 | 8.73E-17 |
| 7E-3 | 1.20004E-09 | 3.67E-13 |
| 8E-3 | 3.02700E-08 | 2.70E-10 |
| 0.5 | 2.44141E-04 | 0 |

In another example, for the LDPC codeword of block length 5056 bits, an UBER of 1E-18, an RBER of approximately 0.5 and the threshold of 85, the SDC probability is on the order of 1E-54. Thus, while the SDC mitigation system may increase the UBER slightly for a given RBER, the resulting SDC probability may be significantly decreased.

In another nonlimiting example, a Reed-Solomon codeword may contain 285 symbols with each symbol containing 9 bits for a codeword size of 285*9=2565 bits. For an erasure mode due to die fails, a Reed-Solomon decoder (i.e., error correction circuitry configured to implement a Reed-Solomon error correcting code) may be configured to have a correction strength of 10 symbols, in addition to the erasure recovery. Correction strength corresponds to a number of symbols (and/or bits) that may be correctable in a received codeword. A symbol may be in error if one or more bits contained in the symbol are in error. Thus, a single symbol error may be caused by from 1 bit error to 9 bit errors.

SDC may be mitigated (i.e., SDC probability may be reduced), as described herein, while maintaining the symbol correction strength. For this example, the threshold may be 16. A first received codeword with 10 symbol errors that corresponds to a first successful decoded codeword may be rejected by SDC circuitry if the distance between the first received codeword and the first successful decoded codeword is greater than or equal to 16 bits. A second received codeword with 10 symbol errors that corresponds to a second successful decoded codeword by may not be rejected by SDC circuitry if the distance between the second received codeword and the second successful decoded codeword is less than 16 bits. Thus, two successful decoded codewords with the same number of symbol errors may or may not be rejected by the SDC circuitry depending on whether the distance between the respective received codeword and the respective successful decoded codeword is greater than or equal to or less than the threshold.

It may be appreciated that for relatively small RBERs, symbol errors are caused by few bit-errors while for relatively large RBERs, the symbol errors are caused by several bit-errors. The SDC probability for an SDC mitigation system in the erasure mode may be on the order of 1E-20 compared to 2.2E-10 without SDC mitigation.

Table 2 illustrates RBER and uncorrectable block error probability for an SDC mitigation system, for a Reed-Solomon error correcting code. Table 2 further includes a change in block error probability with and without SDC circuitry as well as SDC probability with and without SDC circuitry.

TABLE 2

| RBER | Uncorrectable Block Error Probability | Change in Block Error Probability | SDC Probability Before Mitigation | SDC Probability After Mitigation |
| --- | --- | --- | --- | --- |
| 5E−5 | 8.64E−19 | 6.82E−38 | 6.72E−49 | 3.09E−59 |
| 8E−5 | 2.22E−16 | 1.17E−34 | 1.07E−45 | 4.96E−56 |
| 2E−4 | 1.60E−15 | 3.99E−33 | 3.88E−22 | 1.78E−32 |
| 3E−4 | 1.25E−13 | 2.34E−30 | 2.73E−20 | 1.26E−30 |
| 4E−4 | 2.68E−12 | 2.08E−28 | 5.26E−19 | 2.42E−29 |
| 5E−4 | 2.82E−11 | 6.60E−27 | 4.98E−18 | 2.30E−28 |
| 0.5 | 1.00E+01 | 1.00E+01 | 2.20E−10 | 1.00E−20 |

Thus, an SDC mitigation system may be configured to reduce an SDC probability for successful decoded codewords corresponding to received codewords read from a memory device. SDC may be mitigated based, at least in part, on a threshold and based, at least in part, on a Hamming distance between a successful decoded codeword and a corresponding received codeword. The SDC may be mitigated without significantly increasing a corresponding UBER and without decreasing a code rate. The comparison may be performed relatively quickly using relatively simple comparator circuitry.

Figure 2:
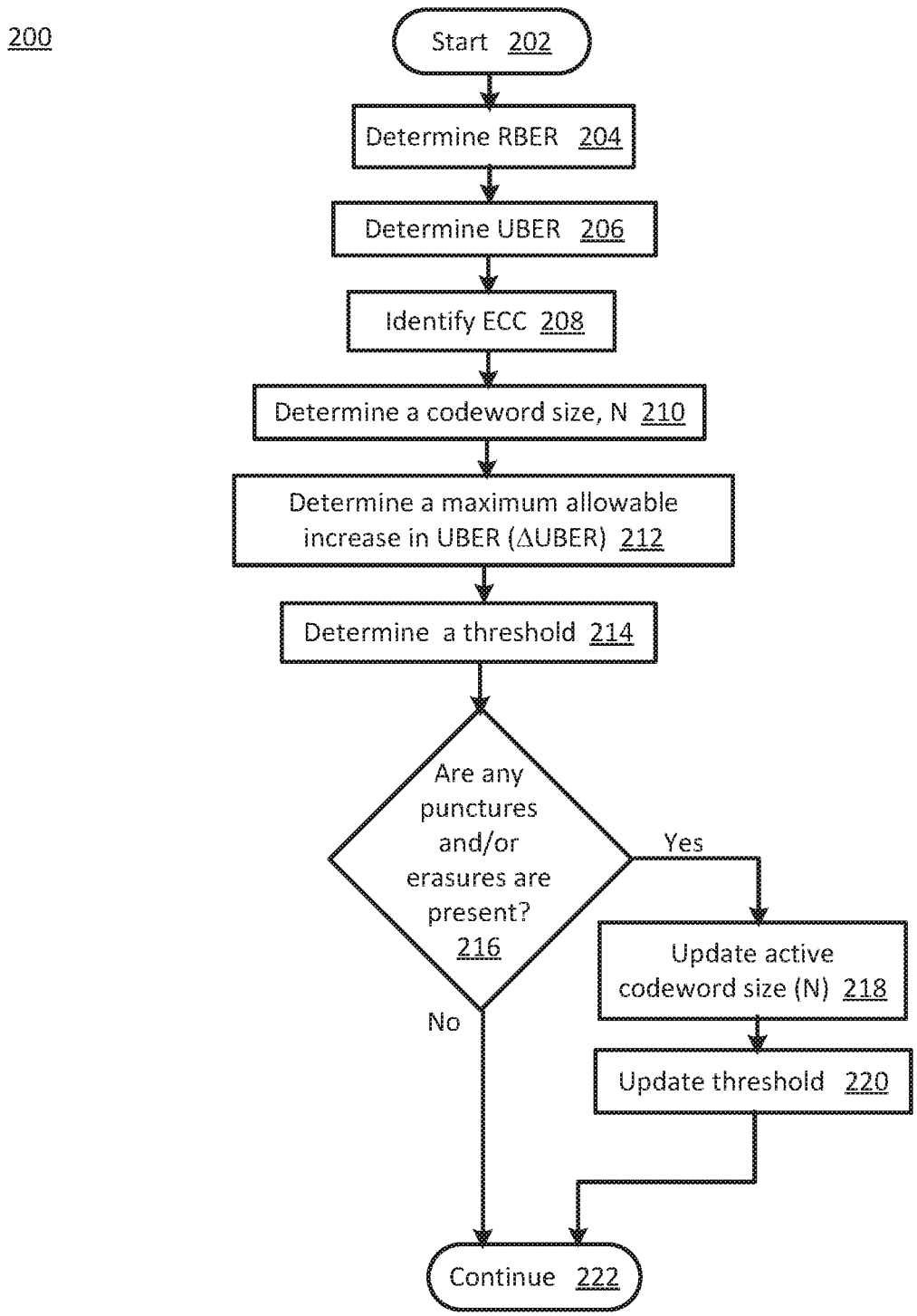
FIG. 2 a flowchart of threshold determination operations according to various embodiments of the present disclosure.

FIG. 2 a flowchart 200 of threshold determination operations according to various embodiments of the present disclosure. In particular, the flowchart 200 illustrates determining a threshold. The threshold may be determined based, at least in part, on an RBER, an ECC and/or an UBER. The operations may be performed, for example, by elements of SDC mitigation circuitry 114, e.g., SDC mitigation logic 120 and/or threshold determination logic 126, of FIG. 1.

Operations of this embodiment may begin with start at operation 202. An RBER may be determined at operation 204. An UBER may be determined at operation 206. An ECC may be identified at operation 208. A codeword size, N, may be determined at operation 210. A maximum allowable increase in UBER, i.e., ΔUBER, may be determined at operation 212. A threshold may be determined at operation 214. Whether any punctures and/or erasures are present may be determined at operation 216. If punctures and/erasures are not present, then program flow may continue at operation 222. If punctures and/or erasures are present, then active codeword size may be updated at operation 218. The threshold may then be updated at operation 220. Program flow may then proceed to operation 222.

Thus, a threshold may be determined and/or updated.

Figure 3:
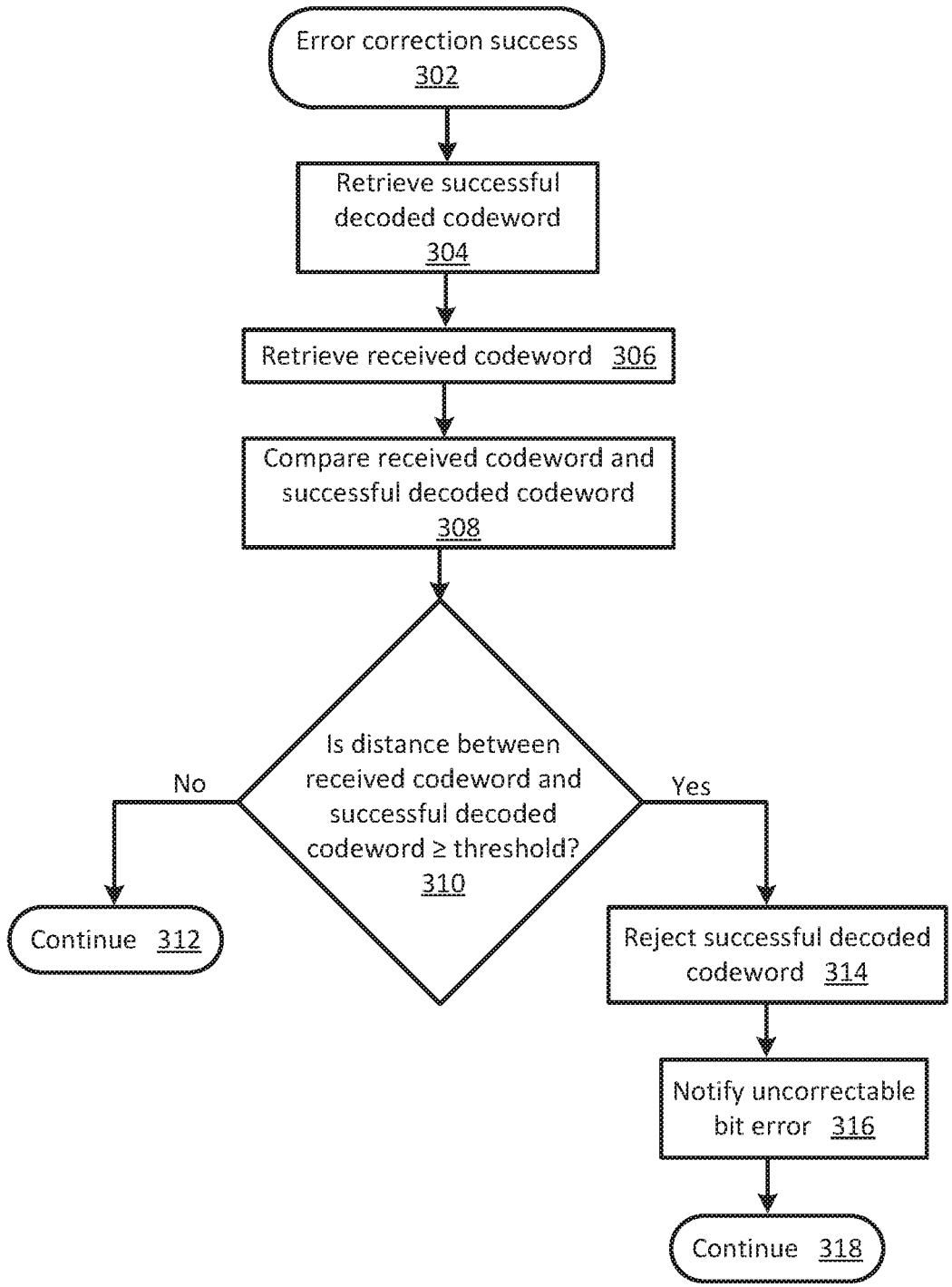
FIG. 3 a flowchart of SDC mitigation operations according to various embodiments of the present disclosure.

FIG. 3 is a flowchart 300 of SDC mitigation operations according to various embodiments of the present disclosure. In particular, the flowchart 300 illustrates determining whether a distance between a successful decoded codeword and a corresponding received codeword is greater than or equal to a threshold. The successful decoded codeword is a decoded codeword deemed a success by error correction circuitry. The operations may be performed, for example, by elements of SDC mitigation circuitry 114, e.g., SDC mitigation logic 120 and/or comparator circuitry 122, of FIG. 1.

Operations of this embodiment may begin with an indication of an error correction success at operation 302. Operation 304 includes retrieving a successful decoded codeword. Operation 306 includes retrieving a corresponding received codeword. Operation 308 includes comparing the corresponding received codeword and the successful decoded codeword. Whether a distance between the received codeword and the successful decoded codeword is greater than or equal to a threshold may be determined at operation 310. If the distance between the received codeword and the successful decoded codeword is not greater than or equal to the threshold, program flow may continue at operation 312. If the distance between the received codeword and the successful decoded codeword is greater than or equal to the threshold, then the successful decoded codeword may be rejected at operation 314. An uncorrectable bit error may then be notified at operation 316. Program flow may then continue in operation 318.

Thus, a successful decoded codeword may be rejected if the distance between the corresponding received codeword and the successful decoded codeword is greater than or equal to a threshold.

While the flowchart of FIGS. 2 and 3 illustrate operations according various embodiments, it is to be understood that not all of the operations depicted in FIGS. 2 and 3 are necessary for other embodiments. In addition, it is fully contemplated herein that in other embodiments of the present disclosure, the operations depicted in FIGS. 2, 3 and/or other operations described herein may be combined in a manner not specifically shown in any of the drawings, and such embodiments may include less or more operations than are illustrated in FIGS. 2 and 3. Thus, claims directed to features and/or operations that are not exactly shown in one drawing are deemed within the scope and content of the present disclosure.

As used in any embodiment herein, the term "logic" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry," as used in any embodiment herein, may comprise, for example, singly or in any combination, hardwired circuitry, programmable circuitry such as computer processors comprising one or more individual instruction processing cores, state machine circuitry, logic and/or firmware that stores instructions executed by programmable circuitry. The circuitry may be embodied as an integrated circuit, such as an integrated circuit chip. In some embodiments, the circuitry may be formed, at least in part, by the processor circuitry 102 executing code and/or instructions sets (e.g., software, firmware, etc.) corresponding to the functionality described herein, thus transforming a general-purpose processor into a specific-purpose processing environment to perform one or more of the operations described herein. In some embodiments, the various components and circuitry of the memory controller circuitry or other systems may be combined in a system-on-a-chip (SoC) architecture.

The foregoing provides example system architectures and methodologies, however, modifications to the present disclosure are possible. The processor may include one or more processor cores and may be configured to execute system software. System software may include, for example, an operating system. Device memory may include I/O memory buffers configured to store one or more data packets that are to be transmitted by, or received by, a network interface.

The operating system (OS) may be configured to manage system resources and control tasks that are run on, e.g., system 100. For example, the OS may be implemented using Microsoft® Windows®, HP-UX®, Linux®, or UNIX®, although other operating systems may be used. In another example, the OS may be implemented using Android™, iOS, Windows Phone® or BlackBerry®. In some embodiments, the OS may be replaced by a virtual machine monitor (or hypervisor) which may provide a layer of abstraction for underlying hardware to various operating systems (virtual machines) running on one or more processing units. The operating system and/or virtual machine may implement a protocol stack. A protocol stack may execute one or more programs to process packets. An example of a protocol stack is a TCP/IP (Transport Control Protocol/Internet Protocol) protocol stack comprising one or more programs for handling (e.g., processing or generating) packets to transmit and/or receive over a network.

SDC mitigation memory 124 may include one or more of the following types of memory: semiconductor firmware memory, programmable memory, non-volatile memory, read only memory, electrically programmable memory, random access memory, flash memory, magnetic disk memory, and/ or optical disk memory. Either additionally or alternatively system memory may include other and/or later-developed types of computer-readable memory.

Embodiments of the operations described herein may be implemented in a computer-readable storage device having stored thereon instructions that when executed by one or more processors perform the methods. The processor may include, for example, a processing unit and/or programmable circuitry. The storage device may include a machine readable storage device including any type of tangible, non-transitory storage device, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of storage devices suitable for storing electronic instructions.

In some embodiments, a hardware description language (HDL) may be used to specify circuit and/or logic implementation(s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

EXAMPLES

Examples of the present disclosure include subject material such as a method, means for performing acts of the method, a device, or of an apparatus or system related to mitigating silent data corruption in error control coding, as discussed below.

Example 1

According to this example, there is provided a silent data corruption (SDC) mitigation circuitry. The SDC mitigation circuitry includes a comparator circuitry and an SDC mitigation logic. The comparator circuitry is to compare a successful decoded codeword and a corresponding received codeword, the successful decoded codeword having been deemed a success by an error correction circuitry. The SDC mitigation logic is to reject the successful decoded codeword if a distance between the corresponding received codeword and the successful decoded codeword is greater than or equal to a threshold.

Example 2

This example includes the elements of example 1, wherein the distance is a Hamming distance and the comparison is bit level.

Example 3

This example includes the elements of example 1, further including a threshold determination logic to determine the threshold.

Example 4

This example includes the elements of example 1, wherein the threshold is determined based, at least in part, on a selected error correcting code.

Example 5

This example includes the elements of example 4, wherein the error correcting code is selected from the group including a low density parity check (LDPC) error correcting code and a Reed-Solomon error correcting code.

Example 6

This example includes the elements according to any one of examples 1 to 4, wherein the threshold is determined based, at least in part, on whether the codewords are punctured and/or contain erasures.

Example 7

This example includes the elements according to any one of examples 1 to 4, wherein the threshold is determined based, at least in part, on a binomial distribution of a raw bit error rate (RBER) for codewords of size N bits.

Example 8

This example includes the elements of example 3, wherein the threshold determination logic is to update the threshold, if a puncture and/or an erasure is present, the updating based, at least in part, on an active codeword size.

Example 9

This example includes the elements according to any one of examples 1 to 4, wherein the threshold is determined based, at least in part, on a maximum allowable change in an uncorrectable bit error rate (UBER).

Example 10

This example includes the elements of example 9, wherein the maximum allowable change in the UBER is less than one percent of the UBER.

Example 11

According to this example, there is provided a method. The method includes comparing, by a comparator circuitry, a successful decoded codeword and a corresponding received codeword, the successful decoded codeword having been deemed a success by an error correction circuitry. The method further includes rejecting, by an SDC mitigation logic, the successful decoded codeword if a distance between the corresponding received codeword and the successful decoded codeword is greater than or equal to a threshold.

Example 12

This example includes the elements of example 11, wherein the distance is a Hamming distance and the comparison is bit level.

Example 13

This example includes the elements of example 11, further including determining, by a threshold determination logic, the threshold.

Example 14

This example includes the elements of example 11, wherein the threshold is determined based, at least in part, on a selected error correcting code.

Example 15

This example includes the elements of example 14, wherein the error correcting code is selected from the group including a low density parity check (LDPC) error correcting code and a Reed-Solomon error correcting code.

Example 16

This example includes the elements of example 11, wherein the threshold is determined based, at least in part, on whether the codewords are punctured and/or contain erasures.

Example 17

This example includes the elements of example 11, wherein the threshold is determined based, at least in part, on a binomial distribution of a raw bit error rate (RBER) for codewords of size N bits.

Example 18

This example includes the elements of example 13, further including updating, by the threshold determination logic, the threshold, if a puncture and/or an erasure is present, the updating based, at least in part, on an active codeword size.

Example 19

This example includes the elements of example 11, wherein the threshold is determined based, at least in part, on a maximum allowable change in an uncorrectable bit error rate (UBER).

Example 20

This example includes the elements of example 19, wherein the maximum allowable change in the UBER is less than one percent of the UBER.

Example 21

According to this example, there is provided a system. The system includes a processor circuitry, a memory device; and a memory controller including a silent data corruption (SDC) mitigation circuitry. The SDC mitigation circuitry includes a comparator circuitry and an SDC mitigation logic. The comparator circuitry is to compare a successful decoded codeword and a corresponding received codeword, the successful decoded codeword having been deemed a success by an error correction circuitry. The SDC mitigation logic is to reject the successful decoded codeword if a distance between the corresponding received codeword and the successful decoded codeword is greater than or equal to a threshold.

Example 22

This example includes the elements of example 21, wherein the distance is a Hamming distance and the comparison is bit level.

Example 23

This example includes the elements of example 21, wherein the memory controller further includes a threshold determination logic to determine the threshold.

Example 24

This example includes the elements of example 21, wherein the threshold is determined based, at least in part, on a selected error correcting code.

Example 25

This example includes the elements of example 24, wherein the error correcting code is selected from the group including a low density parity check (LDPC) error correcting code and a Reed-Solomon error correcting code.

Example 26

This example includes the elements according to any one of examples 21 to 24, wherein the threshold is determined based, at least in part, on whether the codewords are punctured and/or contain erasures.

Example 27

This example includes the elements according to any one of examples 21 to 24, wherein the threshold is determined based, at least in part, on a binomial distribution of a raw bit error rate (RBER) for codewords of size N bits.

Example 28

This example includes the elements of example 23, wherein the threshold determination logic is to update the threshold, if a puncture and/or an erasure is present, the updating based, at least in part, on an active codeword size.

Example 29

This example includes the elements according to any one of examples 21 to 24, wherein the threshold is determined based, at least in part, on a maximum allowable change in an uncorrectable bit error rate (UBER).

Example 30

This example includes the elements of example 29, wherein the maximum allowable change in the UBER is less than one percent of the UBER.

Example 31

According to this example, there is provided a computer readable storage device. The device has stored thereon instructions that when executed by one or more processors result in the following operations including: comparing a successful decoded codeword and a corresponding received codeword, the successful decoded codeword having been deemed a success by an error correction circuitry; and rejecting the successful decoded codeword if a distance between the corresponding received codeword and the successful decoded codeword is greater than or equal to a threshold.

Example 32

This example includes the elements of example 31, wherein the distance is a Hamming distance and the comparison is bit level.

Example 33

This example includes the elements of example 31, wherein the instructions that when executed by one or more processors results in the following additional operations including determining the threshold.

Example 34

This example includes the elements of example 31, wherein the threshold is determined based, at least in part, on a selected error correcting code.

Example 35

This example includes the elements of example 34, wherein the error correcting code is selected from the group including a low density parity check (LDPC) error correcting code and a Reed-Solomon error correcting code.

Example 36

This example includes the elements according to any one of examples 31 to 34, wherein the threshold is determined based, at least in part, on whether the codewords are punctured and/or contain erasures.

Example 37

This example includes the elements according to any one of examples 31 to 34, wherein the threshold is determined based, at least in part, on a binomial distribution of a raw bit error rate (RBER) for codewords of size N bits.

Example 38

This example includes the elements of example 33, wherein the instructions that when executed by one or more processors results in the following additional operations including updating the threshold, if a puncture and/or an erasure is present, the updating based, at least in part, on an active codeword size.

Example 39

This example includes the elements according to any one of examples 31 to 34, wherein the threshold is determined based, at least in part, on a maximum allowable change in an uncorrectable bit error rate (UBER).

Example 40

This example includes the elements of example 39, wherein the maximum allowable change in the UBER is less than one percent of the UBER.

Example 41

According to this example, there is provided a device. The device includes means for comparing, by a comparator circuitry, a successful decoded codeword and a corresponding received codeword, the successful decoded codeword having been deemed a success by an error correction circuitry. The device further includes means for rejecting, by an SDC mitigation logic, the successful decoded codeword if a distance between the corresponding received codeword and the successful decoded codeword is greater than or equal to a threshold.

Example 42

This example includes the elements of example 41, wherein the distance is a Hamming distance and the comparison is bit level.

Example 43

This example includes the elements of example 41, further including means for determining, by a threshold determination logic, the threshold.

Example 44

This example includes the elements of example 41, wherein the threshold is determined based, at least in part, on a selected error correcting code.

Example 45

This example includes the elements of example 44, wherein the error correcting code is selected from the group including a low density parity check (LDPC) error correcting code and a Reed-Solomon error correcting code.

Example 46

This example includes the elements according to any one of examples 41 to 44, wherein the threshold is determined based, at least in part, on whether the codewords are punctured and/or contain erasures.

Example 47

This example includes the elements according to any one of examples 41 to 44, wherein the threshold is determined based, at least in part, on a binomial distribution of a raw bit error rate (RBER) for codewords of size N bits.

Example 48

This example includes the elements of example 43, further including means for updating, by the threshold determination logic, the threshold, if a puncture and/or an erasure is present, the updating based, at least in part, on an active codeword size.

Example 49

This example includes the elements according to any one of examples 41 to 44, wherein the threshold is determined based, at least in part, on a maximum allowable change in an uncorrectable bit error rate (UBER).

Example 50

This example includes the elements of example 49, wherein the maximum allowable change in the UBER is less than one percent of the UBER.

Example 51

According to this example, there is provided a system. The system includes at least one device arranged to perform the method of any one of examples 11 to 20.

Example 52

According to this example, there is provided a device. The device includes means to perform the method of any one of examples 11 to 20.

Example 53

According to this example, there is provided a computer readable storage device. The device has stored thereon instructions that when executed by one or more processors result in the following operations including: the method according to any one of examples 11 to 20.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A silent data corruption (SDC) mitigation apparatus, comprising:
   threshold determination circuitry to determine a first uncorrectable bit error rate (UBER), the threshold determination circuitry to further determine a threshold based on a maximum allowable change in UBER;
   comparator circuitry to compare a successful decoded codeword and a corresponding received codeword, the successful decoded codeword having been deemed a success by an error correction circuitry; and
   SDC mitigation circuitry to reject the successful decoded codeword if a distance between the corresponding received codeword and the successful decoded codeword is greater than or equal to the threshold;
   wherein rejecting the successful decoded code results in a second UBER;
   wherein a difference between the first UBER and the second UBER is less than or equal to the maximum allowable change in UBER; and
   wherein to reject the successful decoded codeword includes to provide one or more notifications of an uncorrectable bit error to memory controller circuitry communicatively coupled to the SDC mitigation circuitry.

2. The SDC mitigation apparatus of claim 1, wherein the distance is a Hamming distance and the comparison is bit level.

3. The SDC mitigation apparatus of claim 1, wherein the threshold is determined based, at least in part, on a selected error correcting code, the error correcting code selected from the group comprising a low density parity check (LDPC) error correcting code and a Reed-Solomon error correcting code.

4. The SDC mitigation apparatus of claim 1, wherein the threshold is determined based, at least in part, on whether the codewords are punctured and/or contain erasures.

5. The SDC mitigation apparatus of claim 1, wherein the threshold is determined based, at least in part, on a binomial distribution of a raw bit error rate (RBER) for codewords of size N bits.

6. A method comprising:
   determining, via threshold determination circuitry, a first uncorrectable bit error rate (UBER);
   determining, via the threshold determination circuitry, a threshold based on a maximum allowable change in UBER;
   comparing, via comparator circuitry, a successful decoded codeword and a corresponding received codeword, the successful decoded codeword having been deemed a success by an error correction circuitry; and
   rejecting, via SDC mitigation circuitry, the successful decoded codeword responsive to a determination that a distance between the corresponding received codeword and the successful decoded codeword is greater than or equal to the threshold;
   wherein rejecting the successful decoded code results in a second UBER;
   wherein a difference between the first UBER and the second UBER is less than or equal to the maximum allowable change in UBER; and
   wherein rejecting the successful decoded codeword includes providing one or more notifications of an uncorrectable bit error to memory controller circuitry communicatively coupled to the SDC mitigation circuitry.

7. The method of claim 6, wherein the distance is a Hamming distance and the comparison is bit level.

8. The method of claim 6, wherein the threshold is determined based, at least in part, on a selected error correcting code, the error correcting code selected from the group comprising a low density parity check (LDPC) error correcting code and a Reed-Solomon error correcting code.

9. The method of claim 6, wherein the threshold is determined based, at least in part, on whether the codewords are punctured and/or contain erasures.

10. The method of claim 6, wherein the threshold is determined based, at least in part, on a binomial distribution of a raw bit error rate (RBER) for codewords of size N bits.

11. A system comprising:
- a processor circuitry;
- a memory device; and
- a memory controller comprising a silent data corruption (SDC) mitigation circuitry, the SDC mitigation circuitry comprising:
  - threshold determination circuitry to determine a first uncorrectable bit error rate (UBER), the threshold determination circuitry to further determine a threshold based on a maximum allowable change in UBER;
  - comparator circuitry to compare a successful decoded codeword and a corresponding received codeword, the successful decoded codeword having been deemed a success by an error correction circuitry; and
  - SDC mitigation circuitry to reject the successful decoded codeword if a distance between the corresponding received codeword and the successful decoded codeword is greater than or equal to the threshold;
  - wherein rejecting the successful decoded code results in a second UBER;
  - wherein a difference between the first UBER and the second UBER is less than or equal to the maximum allowable change in UBER.

12. The system of claim 11, wherein the distance is a Hamming distance and the comparison is bit level.

13. The system of claim 11, wherein the threshold is determined based, at least in part, on a selected error correcting code, the error correcting code selected from the group comprising a low density parity check (LDPC) error correcting code and a Reed-Solomon error correcting code.

14. The system of claim 11, wherein the threshold is determined based, at least in part, on whether the codewords are punctured and/or contain erasures.

15. The system of claim 11, wherein the threshold is determined based, at least in part, on a binomial distribution of a raw bit error rate (RBER) for codewords of size N bits.

* * * * *